United States Patent [19]

King et al.

[11] 4,371,981
[45] Feb. 1, 1983

[54] SPECTRAL SQUELCH

[75] Inventors: Dennis D. King; Ronald L. Breitwisch; James D. Nickum, all of Cedar Rapids, Iowa

[73] Assignee: Rockwell International Corporation, El Segundo, Calif.

[21] Appl. No.: 140,397

[22] Filed: Apr. 14, 1980

[51] Int. Cl.³ .............................................. H04B 1/16
[52] U.S. Cl. .................................... 455/219; 455/222
[58] Field of Search ............... 455/212, 218, 219, 220, 455/222, 223, 224, 225, 302, 296, 303, 307; 179/1 P; 358/177

[56] References Cited
U.S. PATENT DOCUMENTS

| | | | |
|---|---|---|---|
| 2,770,721 | 11/1956 | Clark | 455/222 |
| 2,852,622 | 9/1958 | Fedde | 455/222 |
| 3,188,571 | 6/1965 | Michael | 455/219 |
| 3,325,738 | 6/1967 | Busby | 455/218 |
| 3,766,479 | 10/1973 | Thalimer | 455/222 |

Primary Examiner—Tommy P. Chin
Attorney, Agent, or Firm—Terry M. Blackwood; H. Fredrick Hamann

[57] ABSTRACT

A CLIMAX-network-compatible receiver with squelch capability comprises a demodulator for processing RF and IF, a squelch gate in the intelligence processing channel, and squelch gate control circuitry connected between the demodulator IF (or demodulator RF) and the squelch gate. In the control circuitry, a swept band (i.e., swept frequency) type of spectrum analyzer receives the demodulator IF and outputs a waveform whose envelope represents all the frequency components in the tested IF band. The detected envelope of the analyzer output is next treated by a compression-effecting log amplifier whose output is then tested by two different detectors for carrier attributable content and noise attributable content. The outputs of the two detectors are differenced and such difference is used to control the gate. The log amp ensures that the gate is controlled in accordance with the ratio of IF carrier to IF noise, regardless of whether IF gain variations change the difference between IF carrier and IF noise levels.

2 Claims, 3 Drawing Figures 4,371,981

SPECTRAL SQUELCH

This invention relates to radio receivers and to squelch systems.

Squelch systems are commonly employed in VHF and UHF receivers to suppress noise when little or no remote transmission is being received. More particularly, intelligence processing circuits, typically audio circuits, are turned on or off in accordance with excursions of a squelch drive signal across a threshold level. One of the most common receiver squelch systems presently in use, especially in the air transport industry, is the noise squelch system. This system takes the post-detection audio signal and, by filtering, splits same into two components, one above and one below a predetermined audio frequency $F_a$, where $F_a$ is typically 4 kHz. The components below $F_a$ are considered "signal" and the components above $F_a$ are considered "noise". The levels of these two components are compared and the result of such comparison is used to control a squelch gate. Such a system can be preset to operate at any desired signal-to-noise ratio.

Such noise squelch systems work satisfactorily in many applications but produce undesirable results when used in a crowded signal environment such as the offset carrier environment of the ARINC "CLIMAX" network. The CLIMAX network is a line of radio stations across the country with all stations transmitting the same information. Each successive station's carrier frequency is typically offset from the preceding one by five kHz. The CLIMAX network thus permits a pilot to monitor the broadcasts all the way across the country without changing frequencies. However, the typical noise squelch system interprets the offset carrier as noise and disables the receiver audio. In other words, the receiver is often disabled at a time when it should be enabled.

In accordance with the present invention, such problem is addressed and resolved with a squelch system which employs spectral analysis. Other features, objects and advantages of the invention will become more apparent upon reference to the following specification, claims and appended drawings in which FIG. 1 is a schematic representing a receiving system including the presently preferred embodiment of this invention, and FIGS. 2 and 3 represent a frequency spectrum and waveforms useful in explaining the operation of the FIG. 1 apparatus.

DETAILED DESCRIPTION OF THE PREFERRED EMBODIMENT

As briefly mentioned above, the ARINC CLIMAX network comprises a line of radio stations wherein each successive station carrier is offset from the preceding station carrier by, typically, five kHz. A problem condition, namely undesired receiver quieting, often arises when using a conventional noise squelch in such an environment.

The reason for such problem is that a five kHz beat note is created in the receiver, usually in the detector which outputs the audio intelligence. A conventional noise squelch system interprets the beat note as noise and disables the receiver audio. The problem is so acute that when two stations are within 40 dB of the same strength, the receiver is often disabled.

Figure 1:
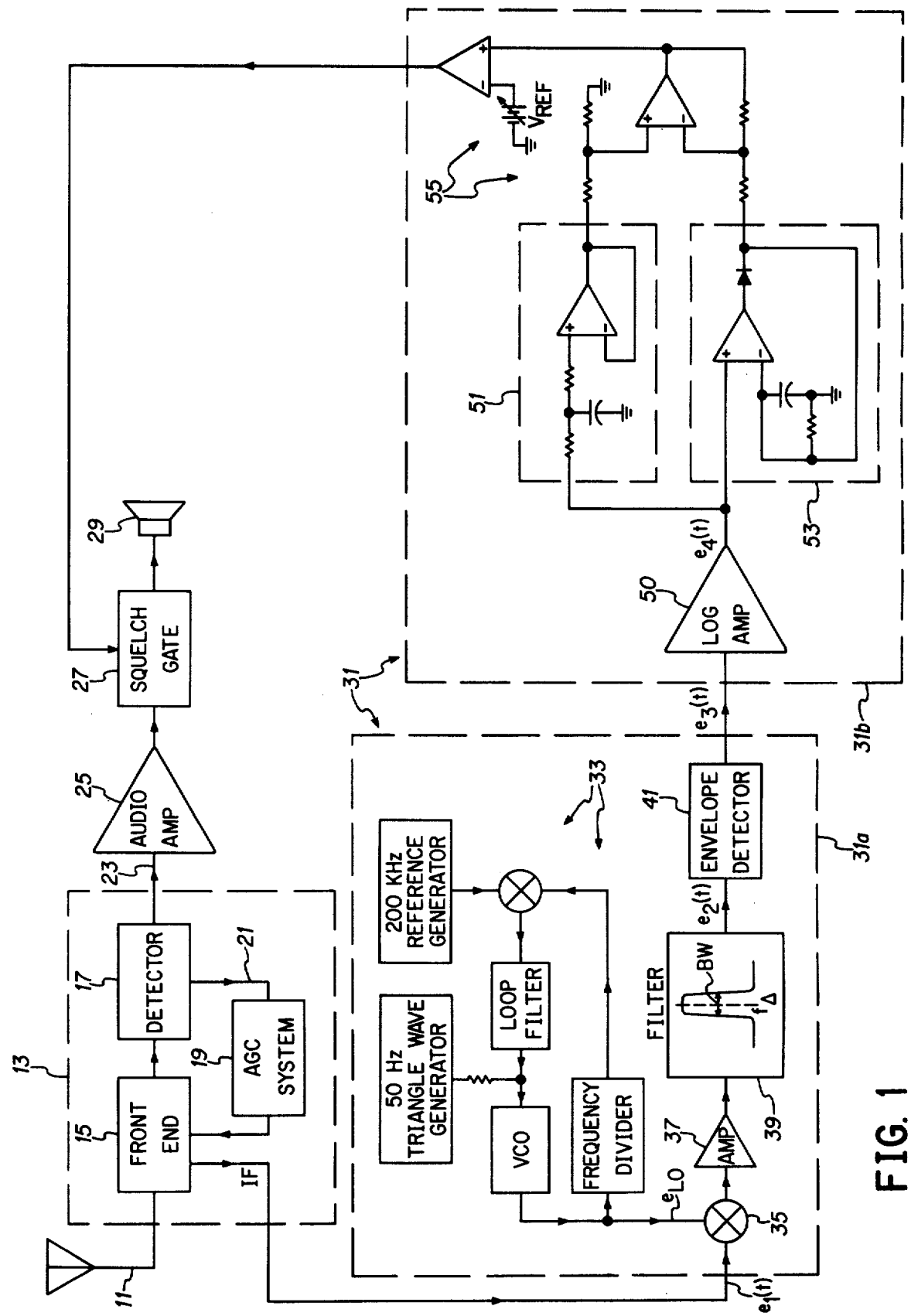

FIG. 1 represents a receiver in which such problem has been eliminated. Since the illustrated receiver embodiment bears many similarities to conventional prior art receivers (for instance see U.S. Pat. No. 3,188,571 assigned to the assignee hereof), the following description will set forth only a brief summary of the well-known and understood receiver portions.

Briefly, then, an incoming remote transmission 11 is fed through demodulator means 13 which includes a receiver front end 15 and a detector 17. An AGC system 19 employs part of detector output 21 to derive feedback for controlling the gain of an amplifier or amplifiers in front end 15. Front end 15 preferably comprises an RF amplifier, a mixer, an oscillator, and one or more IF amplifiers. The detector 17 is usually a diode type AM detector. Other choices, appropriate for the type of transmission being received, will be apparent to those skilled in the art; what is important is that the demodulator recover the intelligence originally impressed on the RF transmission.

In the preferred embodiment, the recovered intelligence is an audio frequency waveform and the demodulator output 23 is connected to an audio channel containing one or more amplifiers 25, a squelch gate 27, and a speaker or headset 29. Squelch gate 27, as controlled by the squelch system, enables or disables speaker 29.

In accordance with the presently preferred inventive embodiment, there is connected between demodulator 13 and squelch gate 27 a squelch system 31 which employs frequency spectrum analysis. More particularly, the demodulator IF is output to a spectrum analyzer 31a whose output in turn is provided to detection system 31b. The presently employed spectrum analyzer 31a is conventional in design and employs a swept frequency (i.e., FM'ed) local oscillator 33, a mixer 35, amplifier 37, a narrow band bandpass filter 39 and envelope detector 41.

It should be noted that, as already implied, the term spectrum analyzer will be used herein in a broader sense than often used. That is, a spectrum analyzer is often understood in the art to mean a device which provides a video or other display of the extracted frequency spectrum information. The term spectrum analyzer is used herein to include devices which extract the spectral content information, and provide an electrical signal containing such information, but do not necessary display such information.

The detection system 31b preferably comprises a log amplifier 50, a noise detector 51, a signal detector 53, and a difference detector 55. In conjunction with the log amp 50, noise detector 51 detects the component of the spectrum analyzer output attributable to nose at the spectrum analyzer input. In conjunction with the log amp 50, signal detector 53 detects the component of the spectrum analyzer output attributable to the strongest carrier at the spectrum analyzer input. Difference detector 55 monitors the difference between the outputs of 51 and 53 and controls the squelch gate 27 in accordance with the comparative magnitude of this difference and a reference voltage. As will become clearer below, log amp 50 is used preceding detectors 51 and 53 to provide a detection enhancing compressor effect and also to reduce influence of IF gain variations.

Describing squelch system 31 now in more detail, and referring to FIG. 1, a 10.7 MHz IF, namely $e_1(t)$, from front end 15, is connected to mixer 35 of spectrum analyzer 31a. Also connected to an input of mixer 35 is the oscillator 33 output $e_{LO}$. Oscillator 33 comprises a phaselock loop whose VCO (voltage controled oscillator) is modulated at the input with a 50 Hz triangle waveform so as to produce an FM'ed VCO output. The frequency divider in the phaselock loop feedback, and the frequency and amplitude of the triangle VCO modulation, are appropriate to produce an $e_{LO}$ whose frequency sweeps from $(8.7-0.008)$ MHz to $(8.7+0.008)$ MHz and then back to $(8.7-0.008)$ MHz every 0.02 seconds. The mixer output difference frequency component thus comprises a version of $e_1(t)$ which is translated in frequency to nominally 2 MHz and which is FM'ed thereabout according to a 50 Hz triangle waveform.

The mixer output is then amplified in amplifier 37 and the amplifier output is connected to bandpass filter 39 whose 3 dB bandwidth BW is one kHz centered at the nominal difference frequency $f_\Delta = 2$ MHz. Filter 39 eliminates all but those frequencies close around 2 MHz and thus the frequency of the output $e_2(t)$ of filter 39 is essentially constant at 2 MHz. The envelope of the filter output $e_2(t)$ varies with time and is a repeating approximately linear representation of the frequency spectrum of $e_1(t)$. Since the frequency sweep of 16 kHz is about the same as the IF passband (which approximately equals 16 kHz), the $e_2(t)$ envelope represents all the frequency components in the IF passband. Or alternatively stated, the $e_2(t)$ envelope represents all the frequency components in $e_1(t)$. As will be further described hereinbelow, due to the triangular shape of the VCO modulation, the $e_2(t)$ envelope, for 10 milliseconds of its 20 millisecond cycle, represents a direct image of the $e_1(t)$ spectrum, whereas for the other 10 milliseconds, the $e_2(t)$ envelope represents a reverse or "mirror" image of the $e_1(t)$ spectrum.

Envelope detector 41 receives the IF-spectrum-representative "AM'ed carrier" $e_2(t)$ and outputs $e_3(t)$ which comprises the envelope of $e_2(t)$. $e_3(t)$ is input to the log amplifier 50 of detection system 31b. Log amplifier 50 output $e_4(t)$ is a logarithmic function of $e_3(t)$. $e_4(t)$ is then input to both a noise detector 51 and a signal detector 53. Noise detector 51 outputs a DC voltage which gently rises or falls in accordance, approximately, with the average amplitude of $e_4(t)$ and thus the detector 51 output is representative of the noise component in $e_1(t)$. Signal detector 53 outputs a DC voltage which gently changes in accordance with the peak level of $e_4(t)$ and thus the detector 53 is representative of the strongest carrier component in $e_1(t)$. In typical signal environments, the presence of carrier components in $e_1(t)$ do not significantly alter the $e_4(t)$ average level and thus detector 51 provides a good indication of noise.

These two detector outputs are then tested by circuit 55 and when a preset difference between the two detector outputs is incurred, the squelch gate is commanded to either disable or enable the receiver, depending on the previous state or condition of the receiver.

As is apparent from the foregoing, detection system 31b controls gate 27 in accordance with the ratio:

[strongest carrier in $e_1(t)$/noise in $e_1(t)$].

More particularly, when this ratio is greater than a predetermined value, then the receiver is enabled. When this ratio is less than said predetermined value, then the receiver is disabled, or quieted. It should be noted that the log amp 50 is employed in the preferred embodiment because it is desired that the squelch trip at a given signal to noise ratio. The log amp ensures that the difference in volts between detector 51 outputs and detector 53 output is independent of variations in IF gain.

Detector 51 may be implemented with a high gain op-amp and comprises a smoothing filter, or low-pass filter. Peak detector 53 may be implemented with a high gain op-amp which drives and maintains a capacitor at the peak level of $e_4(t)$. Difference detector 55 may be implemented with high gain op-amps and may comprise a first stage, whose output is proportional to the difference of the outputs of detectors 51 and 53, and a second stage which compares this difference with a predetermined reference voltage $V_{Ref}$.

Figure 2:
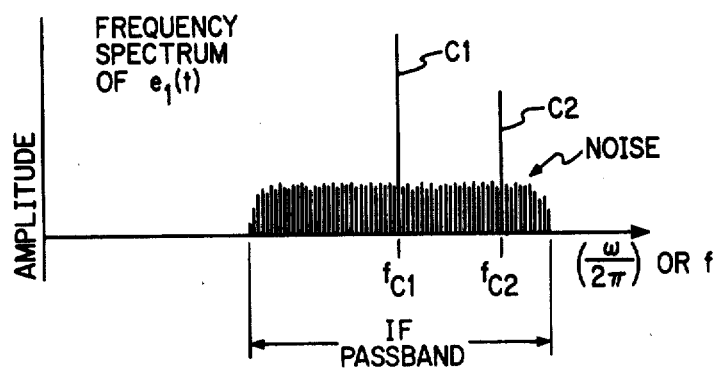
Figure 3:
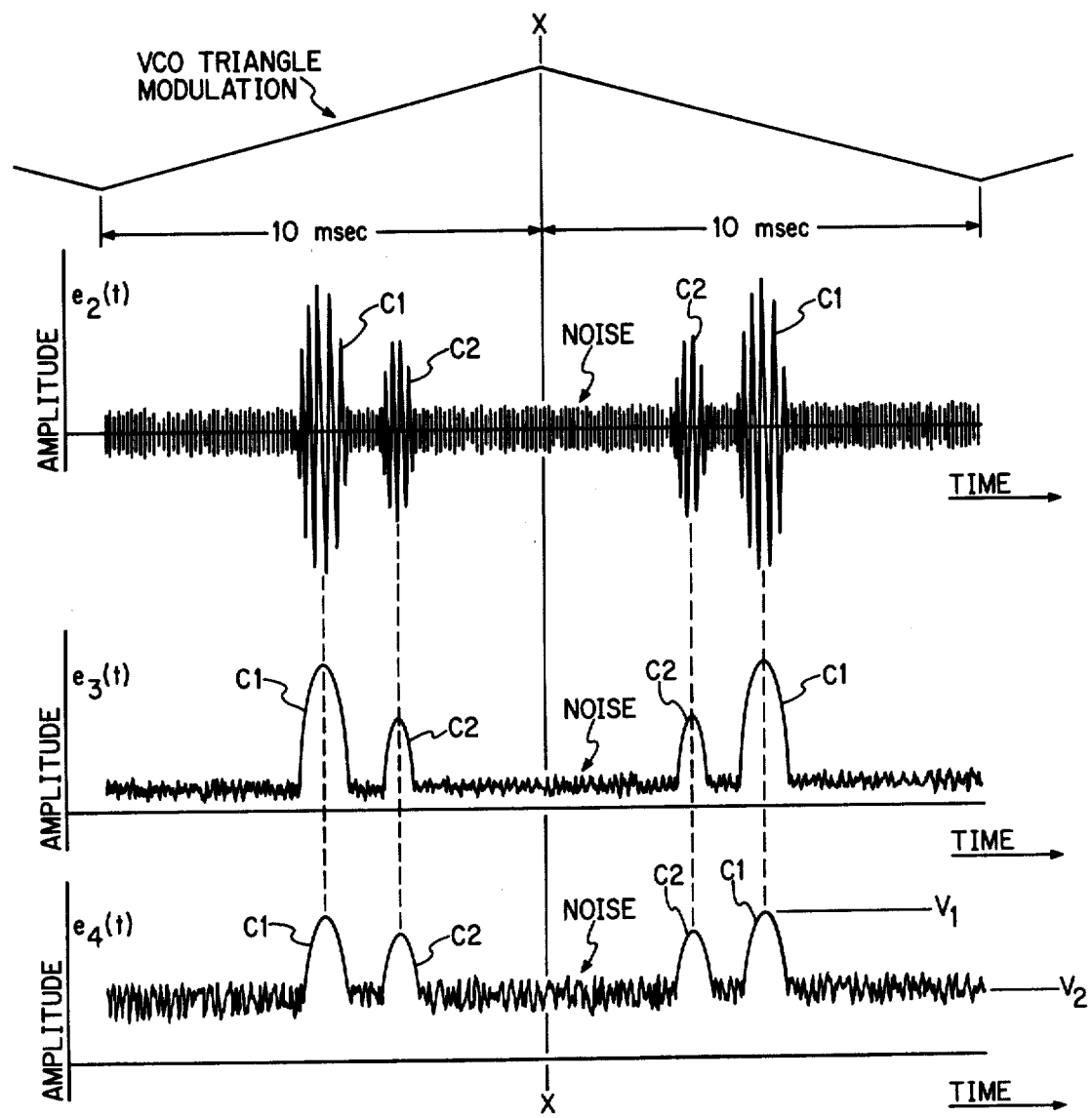

Shown in FIGS. 2 and 3 are graphic representations of amplitude versus frequency and amplitude versus time which aid in illustrating system operation and the nature of $e_1(t)$ through $e_4(t)$ in a representative signal environment. As seen from FIG. 2, which shows the spectral content (i.e., the frequency spectrum) of a specific $e_1(t)$, the illustrated condition assumes noise throughout the IF passband and further assumes the presence of two carriers in the IF passband, one at frequency $f_{c1}$ and the other at frequency $f_{c2}$. As mentioned earlier, $|f_{c1} - f_{c2}|$ is typically five kHz in the CLIMAX environment. It should also be noted that for simplicity in illustration and explanation, audio modulation sidebands are not represented in FIGS. 2 and 3 and thus the illustrated condition most nearly represents the case of two transmitters both with keyed mikes but both absent audio inputs. Moreover, it has been shown that the presence of the modulation sidebands do not significantly alter the effectiveness of operation relative to the illustrated condition.

With the IF containing noise and two cariers, namely, c1 and c2, $e_2(t)$ then comprises amplitude modulated RF, the RF being nominally 2 MHz and the modulation or envelope reflecting and representing the strength of the noise and the carriers. The large $e_2$ envelope peak represents c1, the other $e_2$ envelope peak represents c2, and the lower interim $e_2$ envelope levels represent the noise. The $e_2$ envelope, like the triangular wave modulating the VCO, is periodic at a 50 Hz rate, and as the triangle ranges from its maximum to minimum to maximum amplitude, the $e_2$ envelope represents both a direct image and a mirror image of the IF spectrum. More particularly, for a half period of the triangle wherein the triangle ranges between its maximum and minimum, each different $e_2$ envelope point, in the corresponding half period of $e_2$, represents a different and predetermined IF spectral component between 10.692 and 10.708 MHz. For the remaining half period of the triangle where the triangle wave reverses direction and again ranges between its minimum and maximum, each different $e_2$ envelope point, in the corresponding half period, again represents a different and predetermined IF spectral component between 10.692 and 10.708 MHz. As seen from FIG. 3 however, the representations for these two half periods are mirror images of one another. FIG. 3 indicates this mirror imaging effect about axis X—X.

$e_3(t)$ comprises the envelope of $e_2(t)$, and $e_4(t)$ is substantially a logarithmic function of $e_3(t)$. In comparing the $e_3$ and $e_4$ graphic illustrations, the compressor effect of log amp 50 should be noted. Thus, not only does log amp 50 increase immunity to IF gain variation, it also increases immunity of the detector 51 output to carriers.

Detector 53 outputs a voltage $V_1$ representative of the $e_4(t)$ peak. Detector 51 outputs a voltage $V_2$ representative of the average amplitude of $e_4(t)$. Comparator 55 causes the squelch gate 27 to trip when $(V_1-V_2)$ is equal to a predetermined difference $V_{Ref}$.

As hereinabove stated the spectral squelch principle does not suffer the same problems as noise squelch systems in crowded signal environments. In the illustrated system, carrier c2 does not affect the output of detector 53 and has negligible effect on the output of detector 51.

It should also be apparent that various modifications, some examples of which are set forth below, may be made without departing from the inventive teachings herein. For instance, the spectrum analyzer element might employ a tuneable bandpass filter automatically sweeping over the IF passband, rather than the illustrated principle of sweep-tuning the local oscillator and using a fixed bandpass filter on a mixer output. Also, with faster microprocessors coming along, it will soon be economical to arrive at the information in $e_3$ or $e_4$ using a digital fast Fourier transform technique. Also, a commercial spectrum analyzer could be employed. Also, the spectrum analyzer 31a could include an envelope shaping circuit (following envelope detector 41 for example) to emphasize or deemphasize certain components. For instance, log amplifier 50 could just as well be considered part of 31a instead of 31b as illustrated.

As a further example, the input to the squelch system need not be demodulator IF. For instance, the received RF contains the same information as the IF and thus with appropriate spectrum analyzer adjustments, the demodulator RF could be used as input to the squelch system. Also, as earlier pointed out, using a log amplifier is merely preferred and could be omitted in some applications. Also, alternate embodiments, including digital embodiments might be employed for the signal to noise detection elements 51, 53, and 55. Also, the spectral squelch principle could find application in FM receivers.

Thus, while particular embodiments of the present invention have been shown and/or described, it is apparent that changes and modifications may be made therein without departing from the invention in its broader aspects. The aim of the appended claims, therefore, is to cover all such changes and modifications as fall within the true spirit and scope of the invention.

What is claimed is:

1. A receiver comprising:
   demodulator means including at least one of an RF stage or an IF stage,
   demodulator intelligence processing means connected to said demodulator means, and including gating means, and
   squelch circuit means connected to said demodulator means and to said gating means for controlling said gating means, said squelch circuit means comprising (i) a swept band spectrum analyzer first means connected to said demodulator means for receiving as input a predetermined one of demodulator RF or IF, the received input containing noise and possibly one or more RF or IF carriers, said first means for providing, in response to its received input, a single output whose amplitude varies with time and which is representative of the frequency spectrum of the received input, (ii) second means connected to the single output of said first means, and having a predetermined output amplitude versus input amplitude transfer function, said transfer function being non-linear and for effecting compression, and (iii) third means, connected for receiving an output of said second means, for commanding said gating means to a disable condition whenever a predetermined ratio of (A) strongest carrier in the first means input, to (B) noise in the first means input, is incurred, said commanding occurring at said ratio even if from one instance of commanding to another there is a change in the magnitude of difference between (A) and (B).

2. A receiver as defined in claim 1 wherein the transfer function is a logarithmic transfer function, and said third means comprises means for commanding said gating means to a disable condition when there is incurred a predetermined difference between (a) the second means output component attributable to the first means input noise, and (b) the second means output component attributable to the strongest first means input carrier.

* * * * *